United States Patent
Yoon

(10) Patent No.: US 10,886,141 B2
(45) Date of Patent: Jan. 5, 2021

(54) METHOD OF DEPOSITING TUNGSTEN

(71) Applicant: WONIK IPS CO., LTD., Pyeongtaek-si (KR)

(72) Inventor: Won Jun Yoon, Seoul (KR)

(73) Assignee: WONIK IPS CO., LTD., Pyeongtaek-si (KR)

(*) Notice: Subject to any disclaimer, the term of this patent is extended or adjusted under 35 U.S.C. 154(b) by 0 days.

(21) Appl. No.: 16/520,989

(22) Filed: Jul. 24, 2019

(65) Prior Publication Data

US 2020/0035507 A1    Jan. 30, 2020

(30) Foreign Application Priority Data

Jul. 30, 2018  (KR) .................. 10-2018-0088441

(51) Int. Cl.
*H01L 21/00*   (2006.01)
*H01L 21/3205*  (2006.01)
(Continued)

(52) U.S. Cl.
CPC ...... *H01L 21/32051* (2013.01); *H01L 21/205* (2013.01); *H01L 21/28562* (2013.01); *H01L 21/76876* (2013.01); *C23C 16/14* (2013.01)

(58) Field of Classification Search
CPC ............. H01L 21/205; H01L 21/76876; H01L 21/32051; H01L 21/28562;
(Continued)

(56) References Cited

U.S. PATENT DOCUMENTS 6,686,278 B2 * 2/2004 Wang ................ H01L 21/28562
                                                    257/E21.171
7,465,666 B2 * 12/2008 Kori .................... C23C 16/0272
                                                    438/685

(Continued)

FOREIGN PATENT DOCUMENTS

JP     2008103370 A    5/2008
JP     2017014615 A    1/2017
KR  1019940021758 A   10/1994

*Primary Examiner* — Nikolay K Yushin
(74) *Attorney, Agent, or Firm* — William Park & Associates Ltd.

(57) ABSTRACT

Provided is a method of depositing tungsten, in which depositing a tungsten nucleation layer is formed by performing a unit cycle at least once, wherein the unit cycle includes an absorption step in which a first process gas is provided on a substrate such that at least a portion of the first process gas is absorbed on the substrate, a first purge step in which a purge gas is provided on the substrate to purge the first process gas which has not been absorbed on the substrate, a reaction step in which a gas containing tungsten is provided on the substrate as a second process gas to form a unit deposition film on the substrate, a second purge step in which a purge gas is provided on the substrate to purge a reaction by-product on the substrate, a processing step in which a processing gas containing a hydrogen (H) element is provided on the substrate to reduce the concentration of an impurity in the unit deposition film, and a third purge step in which a purge gas is provided on the substrate to purge the processing gas on the substrate.

6 Claims, 3 Drawing Sheets

(51) Int. Cl.
*H01L 21/768* (2006.01)
*H01L 21/205* (2006.01)
*H01L 21/285* (2006.01)
*C23C 16/14* (2006.01)

(58) Field of Classification Search
CPC .......... H01L 21/76861; C23C 16/0281; C23C 16/45525; C23C 16/00; C23C 16/14
See application file for complete search history.

(56) References Cited

U.S. PATENT DOCUMENTS

| | | | | |
|---|---|---|---|---|
| 8,071,478 B2* | 12/2011 | Wu | ......................... | C23C 16/02 |
| | | | | 257/E21.476 |
| 2002/0192953 A1* | 12/2002 | Wang | ................ | H01L 21/76846 |
| | | | | 438/672 |
| 2007/0009658 A1* | 1/2007 | Yoo | ................... | H01L 21/28562 |
| | | | | 427/248.1 |
| 2007/0254481 A1* | 11/2007 | Kori | ................. | H01L 21/76876 |
| | | | | 438/685 |
| 2010/0167527 A1* | 7/2010 | Wu | ...................... | C23C 16/045 |
| | | | | 438/643 |

\* cited by examiner

METHOD OF DEPOSITING TUNGSTEN

CROSS-REFERENCE TO RELATED APPLICATION

This application claims priority to Korean Patent Application No. 10-2018-0088441 filed on Jul. 30, 2018 and all the benefits accruing therefrom under 35 U.S.C. § 119, the contents of which are incorporated by reference in their entirety.

BACKGROUND

The present disclosure relates to a method of depositing tungsten, and more particularly, to a method of depositing tungsten as a material film applied to an electrode or a wiring structures in a semiconductor element or an electronic device.

Tungsten has low resistance and high thermal stability, and thus, is used as a material applied to an electrode or a wiring structure in a semiconductor element or an electronic device. Furthermore, when a raw material of a chemical reaction for depositing tungsten is used in a gaseous state, it is known that step coverage properties are excellent in a stepped structure having a high aspect ratio. However, depending on the raw material of the chemical reaction, there may be a problem due to an impurity present in the tungsten deposited.

A related art includes Korean Patent Laid-Open Publication No. 19940021758A (published on Oct. 19, 1994, entitled "Method of depositing tungsten thin film").

SUMMARY

The present disclosure provides a method of depositing tungsten, the method capable of reducing impurities in a tungsten nucleation layer. However, this is merely exemplary and does not limit the scope of the present invention.

According to an aspect of the present invention, a method of depositing tungsten is provided. In accordance with an exemplary embodiment, a method of depositing tungsten, in which a tungsten nucleation layer is formed by performing a unit cycle at least once, the unit cycle including an absorption step in which a first process gas is provided on a substrate such that at least a portion of the first process gas is absorbed on the substrate, a first purge step in which a purge gas is provided on the substrate to purge the first process gas which has not been absorbed on the substrate, a reaction step in which a gas containing tungsten is provided on the substrate as a second process gas to form a unit deposition film on the substrate, a second purge step in which a purge gas is provided on the substrate to purge a reaction by-product on the substrate, a processing step in which a processing gas containing a hydrogen (H) element is provided on the substrate to reduce the concentration of an impurity in the unit deposition film, and a third purge step in which a purge gas is provided on the substrate to purge the processing gas on the substrate.

The method of depositing tungsten may further include depositing the tungsten nucleation layer by performing the unit cycle at least once, and then depositing a tungsten bulk layer on the tungsten nucleation layer.

In the method of depositing tungsten, the gas containing tungsten may include $WF_6$ gas, and the impurity may include fluorine (F).

In the method of depositing tungsten, the processing gas may include hydrogen ($H_2$) gas.

In the method of depositing tungsten, the processing gas may include water vapor ($H_2O$) or ammonia ($NH_3$) gas.

In the method of depositing tungsten, the first process gas may include $B_2H_6$ or $SiH_4$.

In the method of depositing tungsten, the processing step may be performed after the second purge step.

In the method of depositing tungsten, the processing step may be performed in any one or more steps except for the reaction step and the second purge step of the unit cycle.

DETAILED DESCRIPTION OF EMBODIMENTS

Hereinafter, specific embodiments will be described in detail with reference to the accompanying drawings.

Throughout the specification, when one element such as a film, a region or a substrate is referred to as being "on" another element, it may be interpreted that the one element directly contacts the other element, or that there may be other elements interposed therebetween. On the other hand, when an element is referred to as being "directly on" another element, it is interpreted that there are no other elements interposing therebetween FIG. 1 is a flow chart illustrating a method of depositing tungsten in accordance with an exemplary embodiment, and FIG. 2 is a diagram schematically illustrating a unit cycle for implementing a tungsten nucleation layer in a method of depositing tungsten in accordance with an exemplary embodiment.

Figure 1:
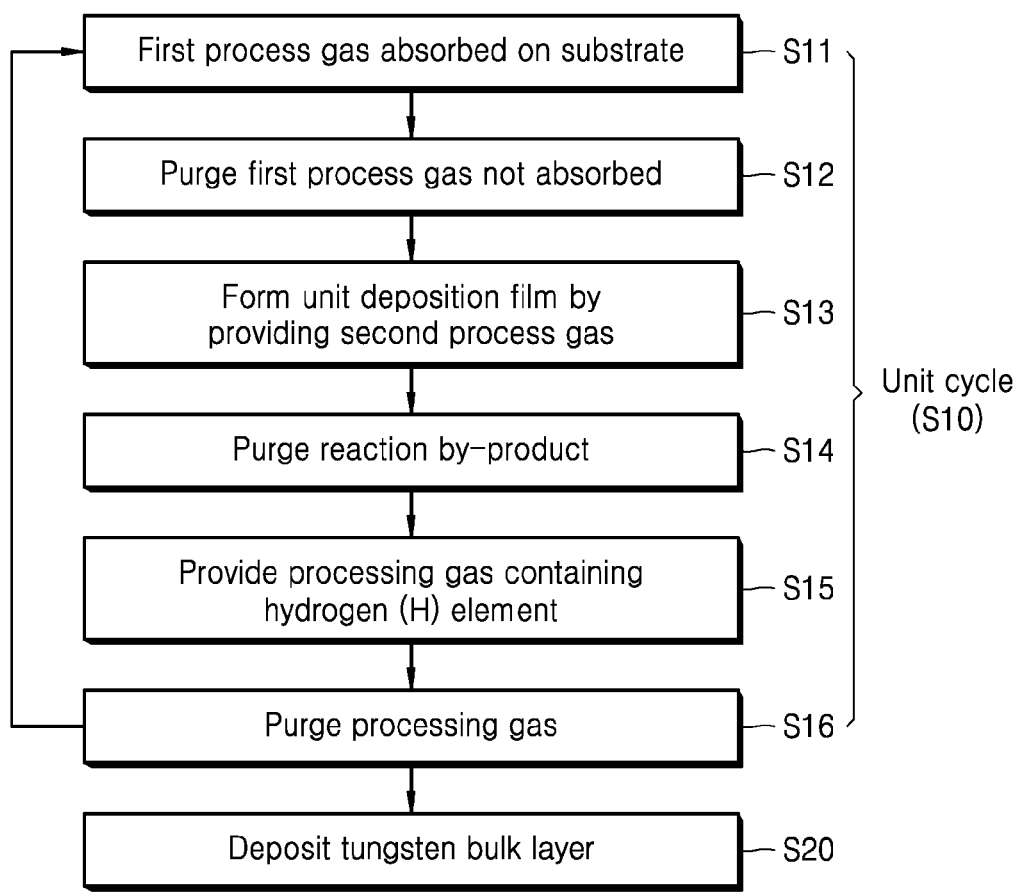
FIG. 1 is a flow chart illustrating a method of depositing tungsten in accordance with an exemplary embodiment.
Figure 2:
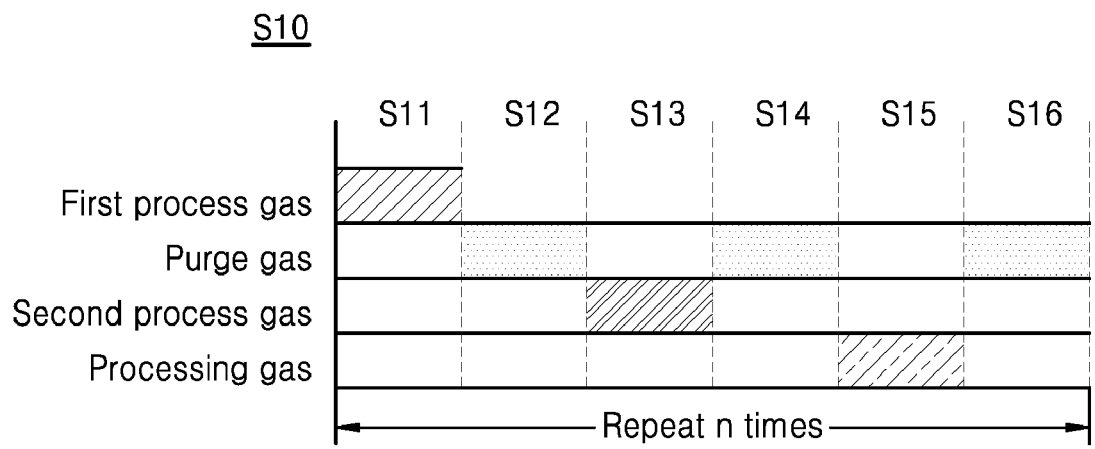
FIG. 2 is a diagram schematically illustrating a unit cycle for implementing a tungsten nucleation layer in a method of depositing tungsten in accordance with an exemplary embodiment.

Referring to FIG. 1 and FIG. 2, the method of depositing tungsten in accordance with an exemplary embodiment of the present invention includes a unit cycle S10 which is performed n (wherein n is a positive integer of 1 or more) times to deposit a tungsten nucleation layer by an atomic layer deposition (ALD) process, and then a step S20 for depositing a tungsten bulk layer on the tungsten nucleation layer.

For example, the tungsten nucleation layer may be implemented by performing the unit cycle S10 a plurality of times, and the step S20 for depositing a tungsten bulk layer may be performed after performing the unit cycle S10 the plurality of times.

For another example, the tungsten nucleation layer may be implemented by performing the unit cycle S10 a single time, and the step S20 for depositing a tungsten bulk layer may be performed after performing the unit cycle S10 the single time.

The step S20 for depositing a tungsten bulk layer may include forming a tungsten bulk layer by reducing tungsten fluoride (WF$_6$) gas, which is a tungsten precursor, to hydrogen (H$_2$) gas, and may be performed by an atomic layer deposition (ALD) process or a chemical vapor deposition (CVD) process.

The unit cycle S10 for implementing a tungsten nucleation layer may include an absorption step S11 in which a first process gas is provided on a substrate such that at least a portion of the first process gas is absorbed on the substrate, a first purge step S12 in which a purge gas is provided on the substrate to purge the first process gas which has not been absorbed on the substrate, a reaction step S13 in which a gas containing tungsten is provided on the substrate as a second process gas to form a unit deposition film on the substrate, a second purge step S14 in which a purge gas is provided on the substrate to purge a reaction by-product on the substrate, a processing step S15 in which a processing gas containing a hydrogen (H) element is provided on the substrate to reduce the concentration of an impurity in the unit deposition film, and a third purge step S16 in which a purge gas is provided on the substrate to purge the processing gas on the substrate.

The substrate may be a substrate on which a predetermined target film or a target pattern is already formed before a tungsten film of any form (tungsten nucleation layer and/or tungsten bulk layer) is deposited. The target film or the target pattern may be, for example, a diffusion protection film or a diffusion prevention pattern including a titanium (Ti) layer and/or a titanium nitride (TiN) layer. However, it is clear that the technical idea of the present invention is not limited to the type of the target film or the target pattern.

The first process gas may perform a function of a reducing gas for forming a tungsten nucleation layer, and thus, may include B$_2$H$_6$ or SiH$_4$. Meanwhile, the gas containing tungsten may include WF$_6$ gas, and the impurity may include fluorine (F). In this case, the processing gas may include hydrogen (H$_2$) gas, water vapor (H$_2$O) or ammonia (NH$_3$) gas.

As an example, a unit cycle S10 for implementing a first tungsten nucleation layer by an atomic layer deposition (ALD) process using SiH4 gas will be described. The first tungsten nucleation layer is formed by an atomic layer deposition (ALD) process by performing the unit cycle S10 n (wherein n is a positive integer of 1 or more) times.

The absorption step S11 in which SiH4 gas is provided on the substrate as a first process gas such that at least a portion of the first process gas is absorbed on the substrate may include a reaction of Formula 1, which is a SiH4 initiation step.

$$SiH_4(g) \rightarrow Si(s) + 2H_2(g)\uparrow \qquad \text{[Formula 1]}$$

Referring to Formula 1, the SiH$_4$ gas is decomposed at a high temperature to generate an amorphous Si. The amorphous Si may prevent a phenomenon in which an element is corroded or deteriorated by WF$_6$ gas which is introduced in a subsequent reaction. In the first purge step S12, a purge gas may be provided to purge the first process gas (SiH$_4$) which has not been absorbed on the substrate and/or H$_2$ gas which is a reaction product by Formula 1.

Meanwhile, the reaction step S13 in which WF$_6$ gas is provided on the substrate as a second process gas to form a unit deposition film on the substrate may include a reaction of Formula 2.

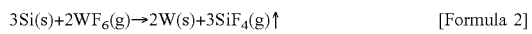

$$3Si(s) + 2WF_6(g) \rightarrow 2W(s) + 3SiF_4(g)\uparrow \qquad \text{[Formula 2]}$$

Tungsten (W) generated in Formula 2 may be understood as a tungsten unit deposition film. The unit deposition film forms at least a portion of the first tungsten nucleation layer, and may protect the element from HF gas which is a by-product generated in the step S20 for depositing a tungsten bulk layer by reducing tungsten fluoride (WF$_6$) gas, which is a tungsten precursor, to hydrogen (H$_2$) gas. The first tungsten nucleation layer formed using SiH$_4$ gas as the first process gas may have an advantageous effect in that the penetration of an element constituting the first process gas to a lower film is insignificant during the formation process, so that adhesion or adhesive properties are excellent.

In the second purge step S14, tungsten fluoride (WF$_6$) gas which has not been reacted on the substrate and/or SiF$_4$ gas which is a reaction product by Formula 2 may be purged.

After the second purge step S14, the processing step S15 in which a processing gas containing a hydrogen (H) element is provided on the substrate to reduce the concentration of an impurity (for example, fluorine (F)) in the unit deposition film, and the third purge step S16 in which a purge gas is provided on the substrate to purge the processing gas remaining on the substrate may be performed. The processing gas may include hydrogen (H$_2$) gas, water vapor (H$_2$O) or ammonia (NH$_3$) gas.

As another example, a unit cycle S10 for implementing a second tungsten nucleation layer by an atomic layer deposition (ALD) process using B$_2$H$_6$ gas will be described. The second tungsten nucleation layer is formed by an atomic layer deposition (ALD) process by performing the unit cycle S10 n (wherein n is a positive integer of 1 or more) times.

In this case, the unit cycle S10 may include an absorption step S11 in which B$_2$H$_6$ gas, which is a first process gas, is provided on a substrate such that at least a portion of the B$_2$H$_6$ gas is absorbed on the substrate, a first purge step S12 in which a purge gas is provided on the substrate to purge the B$_2$H$_6$ gas which has not been absorbed on the substrate, a reaction step S13 in which a gas containing tungsten (for example, tungsten fluoride (WF$_6$) gas) is provided on the substrate as a second process gas to form a unit deposition film on the substrate, a second purge step S14 in which a purge gas is provided on the substrate to purge a reaction by-product on the substrate, a processing step S15 in which a processing gas containing a hydrogen (H) element is provided on the substrate to reduce the concentration of an impurity (for example, fluorine (F)) in the unit deposition film, and a third purge step S16 in which a purge gas is provided on the substrate to purge the processing gas on the substrate. The processing gas may include hydrogen (H$_2$) gas, water vapor (H$_2$O) or ammonia (NH$_3$) gas.

The second tungsten nucleation layer may also protect the element from HF gas which is a by-product generated in the step S20 for depositing a tungsten bulk layer by reducing tungsten fluoride (WF$_6$) gas, which is a tungsten precursor, to hydrogen (H$_2$) gas. Furthermore, it was confirmed that the second tungsten nucleation layer formed using B$_2$H$_6$ gas as the first process gas has larger tungsten crystal grains and lower resistivity than the first tungsten nucleation layer formed using SiH$_4$ gas as the first process gas.

The step S20 for depositing a tungsten bulk layer is a step for depositing a tungsten bulk layer on the tungsten nucleation layer using WF$_6$ gas, and may include a reaction of Formula 3 when performed by a chemical vapor deposition process.

$$3H_2(g) + WF_6(g) \rightarrow W(s) + 6HF(g)\uparrow \qquad \text{[Formula 3]}$$

The reaction of Formula 3 is a hydrogen (H$_2$) reduction reaction, and is the main process of a tungsten film forming process. The hydrogen ($H_2$) reduction reaction in the step S20 has a lower tungsten deposition rate than a $SiH_4$ reduction reaction, and thus, has an excellent step coverage in a stepped structure. Since the reduction reaction is a rate limited reaction in which a deposition rate is increased in proportion to the square root of partial pressure of $H_2$ gas, it is easy to control the deposition rate according to a temperature.

When a tungsten bulk layer is directly deposited on a Ti/TiN diffusion prevention film using tungsten fluoride ($WF_6$) gas and hydrogen ($H_2$) gas without forming a tungsten nucleation layer first, there may be a problem in that a so-called volcano phenomenon may occur. This is because fluorine (F) atoms of tungsten fluoride react with the diffusion prevention film to form titanium fluoride ($TiF_3$). In order to prevent the volcano phenomenon from occurring, a tungsten nucleation layer is formed before depositing a tungsten bulk layer so as to prevent tungsten fluoride from reacting with a diffusion prevention film.

As yet another example, the unit cycle S10 for implementing a first tungsten nucleation layer by an atomic layer deposition (ALD) process using $SiH_4$ gas is performed at least once and then the unit cycle S10 for implementing a second tungsten nucleation layer by an atomic layer deposition (ALD) process using $B_2H_6$ gas is performed at least once to sequentially form the first tungsten nucleation layer and the second tungsten nucleation layer using different first process gases before forming a tungsten bulk layer, so that it is possible to implement a tungsten film having excellent adhesive properties and low resistivity.

A case in which a single tungsten nucleation layer is formed using a single first process gas without forming such a complex tungsten nucleation layer may be assumed as a comparative example.

When a tungsten nucleation layer is formed by performing only a step for forming a second tungsten nucleation layer using $B_2H_6$ gas as a first process gas without performing a step for forming a first tungsten nucleation layer using $SiH_4$ gas as a first process gas before the step S20 for forming a tungsten bulk layer by reducing tungsten fluoride ($WF_6$) gas, which is a tungsten precursor, to hydrogen ($H_2$) gas, it is possible to form a thin film having low resistivity. However, adhesion or adhesive properties may be relatively poor due to the penetration of a B element to a lower film.

In addition, when a tungsten nucleation layer is formed by performing only a step for forming a first tungsten nucleation layer using $SiH_4$ gas as a first process gas without performing a step for forming a second tungsten nucleation layer using $B_2H_6$ gas as a first process gas before the step S20 for forming a tungsten bulk layer by reducing tungsten fluoride ($WF_6$) gas, which is a tungsten precursor, to hydrogen ($H_2$) gas, there may be a problem in that adhesive properties are good but resistivity may be high.

In contrast, when a complex tungsten nucleation layer including a first tungsten nucleation layer and a second tungsten nucleation layer formed using different kinds of first process gases was formed, it was confirmed that a nucleation layer having excellent adhesive properties and low resistivity may be effectively implemented without an increase in thickness of a thin film by suppressing the penetration of the B element to a titanium nitride film which is a lower film.

Figure 3:
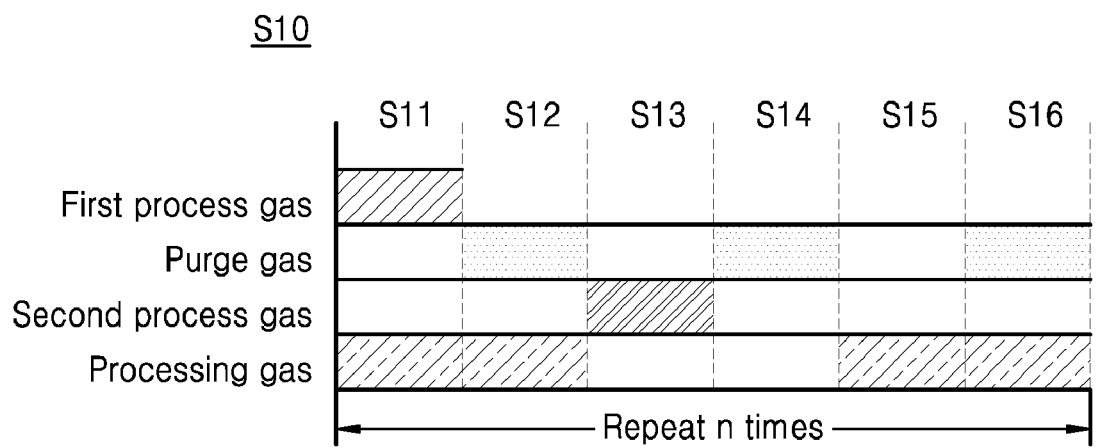
FIG. 3 is a diagram schematically illustrating a unit cycle for implementing a tungsten nucleation layer in a method of depositing tungsten in accordance with another exemplary embodiment.

FIG. 3 is a diagram schematically illustrating a unit cycle for implementing a tungsten nucleation layer in a method of depositing tungsten in accordance with another exemplary embodiment.

In the unit cycle S10 for implementing a tungsten nucleation layer illustrated in FIG. 2, the processing step S15 was performed after the second purge step S14. However, in the unit cycle S10 for implementing a tungsten nucleation layer in the method of depositing tungsten in accordance with another exemplary embodiment of the present invention, the processing step S15 may be performed in any one or more steps except for the reaction step S13 and the second purge step S14. For example, referring to FIG. 3, the processing step S15 may be performed before or after the reaction step S13 and the second purge step S14, respectively.

A processing gas for performing the processing step S15 (for example, hydrogen ($H_2$) gas, water vapor ($H_2O$) or ammonia ($NH_3$) gas) may be provided on the substrate before or after the reaction step S13 and the second purge step S14, respectively. That is, the processing gas may be continuously provided on the substrate during the unit cycle S10, but may not be provided only during the reaction step S13 and the second purge step S14.

In summary, a unit cycle for implementing a tungsten nucleation layer in the method of depositing tungsten according to the technical idea of the present invention may have a variety of modified configurations as well as the configuration disclosed in FIG. 1. That is, the unit cycle S10 disclosed in FIG. 1 has a configuration in which the absorption step S11, the first purge step S12, the reaction step S13, the second purge step S14, the processing step S15, and the third purge step S16 are sequentially performed. However, the processing step S15 may be variously modified.

As an example, the unit cycle S10 may have a configuration in which the processing step S15, the third purge step S16, the absorption step S11, the first purge step S12, the reaction step S13, and the second purge step S14 are sequentially performed.

As another example, the unit cycle S10 may have a configuration in which the absorption step S11, the first purge step S12, the processing step S15, the third purge step S16, the reaction step S13, and the second purge step S14 are sequentially performed.

Hereinafter, Experimental Example in which the concentration of fluorine (F), which is an impurity in a tungsten nucleation layer, was measured in methods for depositing tungsten in accordance with Example and Comparative Examples of the present invention will be described.

Figure 4:
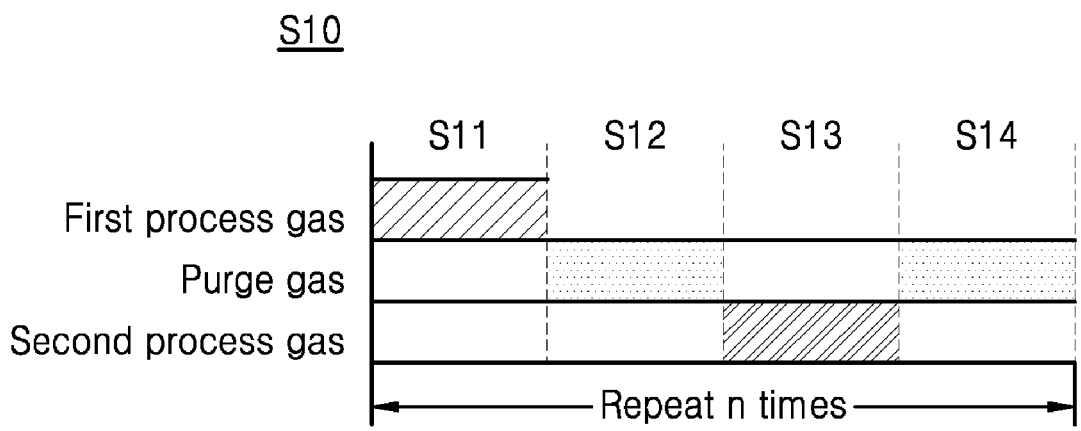
FIG. 4 is a diagram schematically illustrating a unit cycle for implementing a tungsten nucleation layer in a method of depositing tungsten in accordance with Comparative Example 1.
Figure 5:
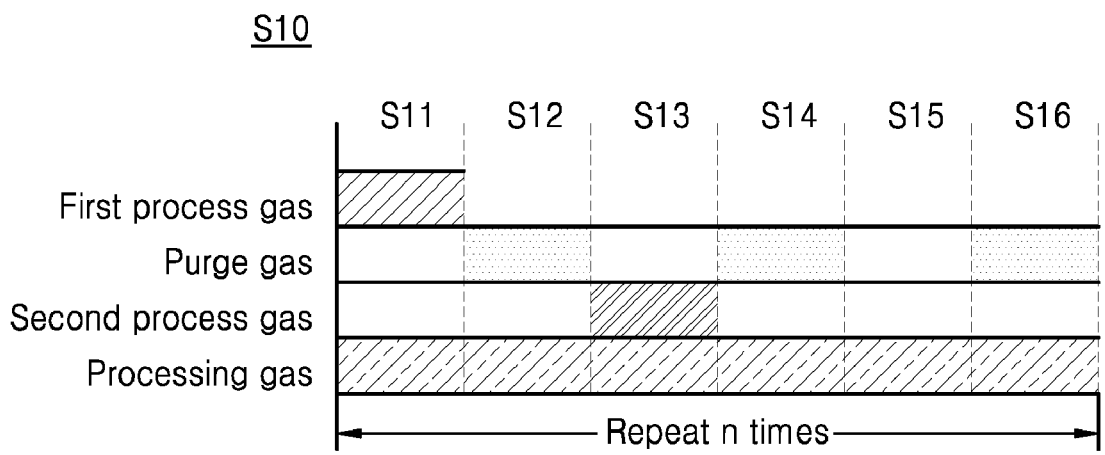
FIG. 5 is a diagram schematically illustrating a unit cycle for implementing a tungsten nucleation layer in a method of depositing tungsten in accordance with Comparative Example 2.

FIG. 4 and FIG. 5 are diagrams schematically illustrating a unit cycle for implementing a tungsten nucleation layer in a method of depositing tungsten in accordance with Comparative Example 1 and Comparative Example 2, respectively.

Tungsten implemented by a method of depositing tungsten in accordance with Example of the present invention has a tungsten nucleation layer formed by repeated performing the unit cycle shown in FIG. 2. Tungsten implemented by a method of depositing tungsten in accordance with Comparative Example 1 has a tungsten nucleation layer formed by repeatedly performing the unit cycle shown in FIG. 4. Tungsten implemented by a method of depositing tungsten in accordance with Comparative Example 2 has a tungsten nucleation layer formed by repeatedly performing the unit cycle shown in FIG. 5.

Referring to FIG. 2, the unit cycle S10 for implementing a tungsten nucleation layer is configured such that the absorption step S11, the first purge step S12, the reaction step S13, the second purge step S14, the processing step S15, and the third purge step S16 which are described above are sequentially performed. However, a processing gas such as hydrogen ($H_2$) gas is provided on the substrate only in the processing step S15. Referring to FIG. 4, the unit cycle S10 for implementing a tungsten nucleation layer is configured such that the absorption step S11, the first purge step S12, the reaction step S13, and the second purge step S14 which are described above are sequentially performed. However, a processing gas such as hydrogen ($H_2$) gas is not separately provided in the unit cycle S10. Referring to FIG. 5, the unit cycle S10 for implementing a tungsten nucleation layer is configured such that the absorption step S11, the first purge step S12, the reaction step S13, the second purge step S14, the processing step S15, and the third purge step S16 which are described above are sequentially performed. However, a processing gas such as hydrogen ($H_2$) gas is configured provided throughout the unit cycle S10.

Table 1 shows the results of measuring the average concentration of fluorine which is an impurity in the tungsten nucleation layer according to Experimental Example of the present invention by using a secondary ion mass spectrometry (SIMS) analysis. The values shown in Table 1 indicate the intensity of signals detected in the SIMS analysis, and are proportional to the average concentration of fluorine.

TABLE 1

|  | Example | Comparative Example 1 | Comparative Example 2 |
|---|---|---|---|
| Average intensity | 129 | 1093 | 654 |

Referring to Table 1, the concentration of fluorine in the tungsten nucleation layer in Comparative Example 1 in which a separate processing gas was not provided on the substrate and the processing step S15 was not performed was the highest, and the concentration of fluorine in the tungsten nucleation layer in Example in which the processing step S15 was performed by providing a processing gas on the substrate after performing the reaction step S13 was the lowest. Meanwhile, the concentration of fluorine in the tungsten nucleation layer in Comparative Example 2 in which a processing gas was continuously provided throughout the unit cycle S10 so that the influence of the processing gas continued in the reaction step S13 and the second purge step S14 was lower than that of Comparative Example 1, but was higher than that of Example.

From the results of Experimental Example, it can be confirmed that it is necessary to have the processing step S15 for removing impurities by providing a processing gas such as hydrogen ($H_2$) gas in the unit cycle S10 of an ALD process for implementing a tungsten nucleation layer, but that it is preferable that the processing gas is not provided on a substrate at least during the reaction step S13.

Although the present invention has been described with reference to the embodiments shown in the drawings, it is merely exemplary. It will be understood by those skilled in the art that various modifications and equivalent other embodiments are possible therefrom. Accordingly, the true technical protection scope of the inventive concept should be determined by the technical idea of the appended claims.

What is claimed is:

1. A method of depositing tungsten, in which a tungsten nucleation layer is formed by performing a unit cycle at least once, wherein the unit cycle includes:
    an absorption step in which a first process gas is provided on a substrate such that at least a portion of the first process gas is absorbed on the substrate;
    a first purge step in which a purge gas is provided on the substrate to purge the first process gas which has not been absorbed on the substrate;
    a reaction step in which a gas containing tungsten is provided on the substrate as a second process gas to form a unit deposition film on the substrate;
    a second purge step in which a purge gas is provided on the substrate to purge a reaction by-product on the substrate;
    a processing step in which a processing gas containing a hydrogen (H) element is provided on the substrate to reduce a concentration of an impurity in the unit deposition film; and
    a third purge step in which a purge gas is provided on the substrate to purge the processing gas on the substrate,
    wherein the processing step is performed in any one or more steps except for the reaction step and the second purge step of the unit cycle, and
    wherein the processing gas containing a hydrogen (H) element is not provided together with the gas containing tungsten in the processing step.

2. The method of claim 1, further comprising depositing a tungsten bulk layer on the tungsten nucleation layer after depositing the tungsten nucleation layer by performing the unit cycle at least once.

3. The method of claim 1, wherein the gas containing tungsten comprises $WF_6$ gas, and the impurity comprises fluorine (F).

4. The method of claim 1, wherein the processing gas comprises hydrogen ($H_2$) gas, water vapor ($H_2O$) or ammonia ($NH_3$) gas.

5. The method of claim 1, wherein the first process gas comprises $B_2H_6$ or $SiH_4$.

6. The method of claim 1, wherein the processing step is performed after the second purge step.

* * * * *